United States Patent
Wouters et al.

(10) Patent No.: US 6,300,144 B1
(45) Date of Patent: Oct. 9, 2001

(54) METHOD FOR FABRICATING FERRO-ELECTRIC THIN FILMS USING A SOL-GEL TECHNIQUE

(75) Inventors: Dirk Wouters, Leuven; Gerd Norga, Antwerp; Herman Maes, Bierbeek; Ria Nouwen, Diepenbeek; Jules Mullens, Hasselt; Dirk Franco, Sint-Truiden; Jan Yperman; Lucien C. Van Poucke, both of Hasselt, all of (BE)

(73) Assignees: Interuniversitair Micro Elecktronica Centrum (IMEC yzw), Leuven; Limburgs Universitair Centrum, Diepenbeek, both of (BE)

( * ) Notice: Subject to any disclaimer, the term of this patent is extended or adjusted under 35 U.S.C. 154(b) by 0 days.

(21) Appl. No.: 09/255,916

(22) Filed: Feb. 23, 1999

Related U.S. Application Data
(60) Provisional application No. 60/076,292, filed on Feb. 27, 1998.

(30) Foreign Application Priority Data

Feb. 25, 1998 (EP) .................................................. 98870038

(51) Int. Cl.[7] .................................................. H01L 21/00
(52) U.S. Cl. .......................... 438/3; 438/240; 427/376.2
(58) Field of Search .............................. 438/785, 3, 240; 427/376.2

(56) References Cited

U.S. PATENT DOCUMENTS

| | | | |
|---|---|---|---|
| 4,946,710 | * | 8/1990 | Miller et al. ...................... 427/126.3 |
| 5,391,393 | * | 2/1995 | Maniar ................................ 427/100 |
| 5,555,486 | * | 9/1996 | Kingon et al. ..................... 361/305 |
| 5,728,603 | * | 3/1998 | Emesh et al. ...................... 437/235 |
| 5,772,735 | * | 6/1998 | Sehgal et al. ............................. 95/45 |
| 5,946,551 | * | 8/1999 | Dimitrakopoulos et al. .......... 438/99 |
| 6,086,665 | * | 7/2000 | Kamisawa et al. ............. 106/287.18 |
| 6,146,905 | * | 11/2000 | Chivukula et al. ...................... 438/3 |

OTHER PUBLICATIONS

Tuttle, B. A., Voigt J.A., Garino T. J., Goodnow G. C., Schwartz R. W., Lamppa D. L., Headley T. J., Eatough M.O. "Chemically Prepared PB(Zr,Ti)O3 Thin Films: The effect of orientation and stress", IEEE, 1992.*

* cited by examiner

Primary Examiner—Matthew Smith
Assistant Examiner—Renzo Rocchegiani
(74) Attorney, Agent, or Firm—Knobbe Martens Olson & Bear LLP

(57) ABSTRACT

A method is disclosed for the formation of ferro-electric films using a multi coating process based on a sol-gel technique. In particular a method is disclosed to fabricate high-quality thickness scaled PZT films of an alkoxide-type liquid chemical PZT precursor solution, preferably a $Pb(Zr_xTi_{1-x})O_3$ precursor solution, using a sol-gel technique. At least two coated layers are deposited, but the precise number of coated layers depends on the desired thickness of the ferro-electric film. According to the method of the invention, the electrical characteristics of the film as formed are not dependent on the number of coated layers. There are a number of properties, characteristic for the method of the present invention, and resulting in said excellent electrical characteristics. In fact said method can comprise a multi coating process wherein a reduced number of coated layers is used but where intermediate crystallization steps are performed. The ferro-electric films formed using this method have excellent electrical characteristics, provided that a crystallization step is only performed if the thickness of the film formed since the last crystallization step is minimum about 40 to 50 nm. Alternatively, the method can comprise a multi coating process wherein no intermediate crystallization steps are used.

13 Claims, 10 Drawing Sheets

METHOD FOR FABRICATING FERRO-ELECTRIC THIN FILMS USING A SOL-GEL TECHNIQUE this application claims the benefit under 35 U.S.C. § 119(e) of the Provisional Application filed Feb. 27, 1998 and assigned Serial No. 60/076,292.

FIELD OF THE INVENTION

The present invention is related to the formation of ferro-electric thin films. Particularly PZT thin films are formed using a sol-gel technique. Such ferro-electric films can be used as a dielectric in a ferro-electric capacitor or as a gate insulating layer in a ferro-electric field effect transistor (FET). Both capacitor and FET can be applied in ferro-electric memories for DRAM, FRAM and non-volatile applications.

BACKGROUND OF THE INVENTION

Ferro-electric thin films are used for the fabrication of ferro-electric non-volatile memories. These memories can be stand alone memories as well as embedded memories, e.g. embedded in a conventional CMOS process as used for the fabrication of integrated circuits. Contrary to the conventional floating gate type non-volatile memories, like e.g. flash or EEPROM, ferro-electric non-volatile memories do not need high voltages, i.e. higher than the supply voltage which is defined by the choice of the process wherein these ferro-electric memories are integrated. Consequently, switching at voltages equal to or below the supply voltage has the advantage that no high-voltage generators have to be integrated in said process. Currently, ferro-electric memories using PZT (Lead-Zirconate-Titanate) films require switching voltages from 3 V to 5 V. However due to the ongoing downscaling of the channellength of MOSFETs fabricated in present and future deep submicron CMOS processes, the supply voltage will also further scale down from 3.3V to 2.5V and to 1.5V. Furthermore, ferro-electric memories are also interesting for portable applications due to their low power consumption. For these portable applications, however, the supply voltage should be compatible with single cell battery operation, i.e. operation has to be guaranteed even down to 0.9 V.

One of the methods to deposit a ferro-electric film, e.g. a PZT film, is the sol-gel spin-on technique. Compared with conventional thin film forming processes such as chemical vapour deposition, evaporation or sputtering, a sol-gel technique requires considerably less equipment. Furthermore, throughout different wet chemical methods for the preparation of ceramic oxides, the sol-gel technique offers great advantages because the stoichiometry of the end product can easily be controlled and because it is possible to obtain products for various applications, like e.g. bulk ceramics, fibres, thick coatings or thin films, starting from almost the same precursor solution. In the sol-gel technique, a chemical precursor solution is spin-coated on a substrate, afterwards different thermal treatments are performed for the evaporation of the solvent, the pyrolysis and the crystallization in order to form a ceramic oxide. Particularly, in case a PZT precursor solution is used, a ferro-electric PZT film can be formed. When one wants to produce a high quality ferro-electric film by means of a sol-gel technique, the first requirement is of course a high quality precursor solution, whose characteristics are adapted to the thin film fabrication.

Contrary to SBT ($SrBi_2Ta_2O_9$) material, where switching at 1.5V is already demonstrated, the fabrication of PZT films on Si substrates showing fully saturated switching at low voltage, i.e. below 3 V, is not yet demonstrated. The most straightforward way of reducing the switching voltage is to decrease the film thickness, provided that this does not deteriorate the electrical characteristics of the films, particularly the value of the remnant polarization $P_r$ and the rectangularity of the hysteresis loops. The remnant polarization value $P_r$ determines the signal magnitude for a given capacitor area, and hence defines the minimal capacitor size. On the other hand, a less rectangular or more slanted loop will result in higher switching voltages $V_s$ which is defined as the amplitude needed to obtain full hysteresis loop opening. However published reports, like K.R. Udayakumar et al., J.Appl.Phys. 77 (8), April 1995, pp. 3981–3986; K. Amanuma et al., Jpn.J.Appl.Phys., Vol. 32 (1993), pp. 4150–4153; L. E. Sanchez et al., Appl. Phys. Lett. 56 (24), June 1990, pp. 2399–2401, on PZT film thickness scaling effects indicate that the electrical characteristics of these films deteriorate if the thickness decreases. Particularly, films which are deposited on Si substrates and use Pt electrodes and which have a reduced film thickness, typically below 200 nm, show a degradation of the electrical characteristics. In particular, one has observed:

a decrease of the remnant polarization, $P_r$;

a slanting of the hysteresis loop, i.e. the hysteresis loop becomes less rectangular;

a decrease of breakdown field;

an increase of the coercive field, $E_c$.

Consequently, the difference between coercive field and saturation field increases and therefore the magnitude of the saturation field, i.e. the electrical field required to obtain full saturated switching increases even stronger than the magnitude of the coercive field with increasing thickness. Moreover, the minimum film thickness below which the electrical characteristics start to deteriorate, strongly varies with the experimental conditions. This indicates that the observed degradations are not intrinsic but due to the ferro-electric capacitor fabrication process and particularly the process conditions for the formation of a ferro-electric thin film and even more particularly the deposition technique. It is therefore at present not clear, particular when said deposition technique is a sol-gel technique, how to fabricate high quality thickness scaled ferro-electric thin films, particularly for a thickness below 200 nm and more particularly for a thickness below 100 nm.

SUMMARY OF THE INVENTION

In an aspect of the invention a method is disclosed for the formation of ferro-electric films using a multi coating process based on a sol-gel technique. In particular PZT films are formed using a sol-gel technique of an alkoxide-type liquid chemical PZT precursor. The mass fractal dimension of the polymeric structures, where said solution is composed of, has to be sufficiently low, i.e. typically smaller than about 2. Furthermore, hydrolysis steps, used during the preparation of said precursor solution, have to be properly controlled to thereby avoid an increase of the mass fractal dimension of the polymeric structures involved and assuring molecular homogeneity throughout the entire film formation process. Preferably said precursor solution is a $Pb(Zr_x Ti_{1-x})O_3$ precursor solution which is prepared, according to an embodiment of the invention, by means of an organic sol-gel technique. Preferably x is in the range from 0.1 to 0.4. Preferably said precursor is diluted in BuEtOH (2-butoxyethanol). Using a more diluted precursor results in thinner coated layers, so in fact the thickness is dependent upon the dilution. According to the present invention, a method for the formation of a ferro-electric film on a substrate is disclosed, comprising the steps of:

a) depositing a ferro-electric layer of a diluted chemical PZT precursor solution on said substrate by means of a sol-gel;

b) evaporating at least the majority of the solvents in said layer by means of a thermal treatment;

c) pyrolysis; and wherein the sequence of steps a), b) and c) is performed at least twice and thereafter a crystallization step is performed resulting in a film having a remnant polaritization varying less then 30% in said thickness range. The pyrolysis is a thermal treatment, which is typically performed at a temperature in the range from 300 to 500° C. without forming perovskite crystals in said ferro-electric layer. Particularly, a range from 300 to 450° C. can be selected. The thermal treatment of the evaporating step is typically performed at a temperature in the range from 150 to 250° C. Steps a), b) and c) can be performed repeatedly until at least 2 layers and maximum 6 layers are deposited. Finally a crystallization step is performed at temperatures typically at 700 ° C. or below. Particularly said crystallisation step can be a heating step on a hot plate. Alternatively said crystallization step can be a rapid thermal processing step in a furnace. In a preferred embodiment of this aspect, no intermediate crystallization steps are performed. The ferro-electric films formed using this method have excellent electrical characteristics.

In an aspect of the invention a method is disclosed for the formation of ferro-electric films using a multi coating process based on a sol-gel technique. In particular PZT films of an alkoxide-type liquid chemical PZT precursor are formed using a sol-gel technique. Therefore the mass fractal dimension of the polymeric structures, where said solution is composed of, has to be sufficiently low, i.e. typically smaller then about 2. Furthermore, hydrolysis steps, used during the preparation of said precursor solution, have to be properly controlled to thereby avoid an increase of the mass fractal dimension of the polymeric structures involved and assuring molecular homogeneity throughout the entire film formation process. Preferably said precursor solution is a $Pb(Zr_xTi_{1-x})O_3$ precursor solution which is prepared, according to an embodiment of the invention, by means of an organic sol-gel technique. Preferably x is in the range from 0.1 to 0.4. Said precursor can be diluted in BuEtOH. According to the present invention a method for the formation of a ferro-electric film on a substrate is disclosed, comprising the steps of:

a) depositing a ferro-electric layer of a chemical PZT precursor solution on said substrate by means of a sol-gel technique;

b) evaporating at least the majority of the solvents in said layer by means of a thermal treatment;

c) pyrolysis;

d) crystallizing said layer at a temperature in the range of 700° C. or below 700° C. and wherein steps a), b), c) and d) are performed at least twice thereby assuring that the last step is a crystallization step and resulting in a film having a remnant polarisation varying less then 30% in said thickness range. Particularly said crystallisation step can be a heating step on a hot plate. Alternatively said crystallisation step can be a rapid thermal processing step in a furnace. Each time a layer is deposited, i.e. step a), the evaporating (step b)) and pyrolysis (step c)) steps are performed subsequently. This pyrolysis is a thermal treatment, which is typically performed at a temperature in the range from 300 to 500° C. without forming perovskite crystals in said ferro-electric layer. Particularly, a range from 300 to 450° C. can be selected. The thermal treatment of the evaporating step is typically performed at a temperature in the range from 150 to 250° C.

After each sequence of steps a), b) and c) one can choose to perform a crystallization step. Preferably this crystallization step is performed if the thickness of the film formed since the last crystallization step is minimum about 40 to 50 nm. Furthermore, at least two layers are deposited thereby assuring that the last step is always a crystallization step. The ferro-electric films formed using this method have excellent electrical characteristics.

In an aspect of the invention a PZT precursor solution is disclosed comprising lead, titanium and zirconium. Particularly, a $Pb(Zr_xTi_{1-x})O_3$ precursor solution for ferro-electric thin film fabrication is disclosed, said precursor solution comprising polymeric structures having a mass fractal dimension equal to or smaller than 2 and having an excellent molecular homogeneity, said precursor solution being diluted in butoxyethanol and where x has a value in the range from 0.1 to 0.4. Starting products are hydrate lead acetate with chemical formula $PbAc_2.3H_2O$, $Zr(OPr)_4$(70% in propanol), $Ti(O^iPr)_4$ and 2-butoxyethanol. Before introduction in the PZT solution, the hydrate lead acetate is dehydrated by means of recrystallization. To prepare the PZT solution, said dehydrated lead acetate is mixed in a flask together with a solvent (2-butoxyethanol) and $Zr(OPr)_4$. The flask is connected to a condenser with a nitrogen filled balloon on top. The mixture, containing a 16% (atomic) excess of said dehydrated lead acetate, is flushed with the nitrogen and then heated in an oil bath up to 130° C. for six hours while agitating said mixture by means of magnetic stirring.

Further, the solution is cooled down and $Ti(O^iPr)_4$ is added. The system is again flushed and refluxed for six hours at 130° C. After cooling down and weighing the filled flask, the resulting clear solution is distilled under vacuum.

A solvent, preferably BuEtOH, is then re-added until the initial weight is reached, and the solution is agitated long enough to be sure that the solvent is homogeneously mixed with the solution. By using a mixture of 2 ml $HNO_3$ (70%, Baker) and 50 ml of BuEtOH, 0.0562 mole $HNO_3$ per mole of PZT is added to the solution while vigorously agitating.

After at least one hour 0.14 mole $H_2O$ per mole of PZT is added by using a mixture of 1.02 ml deionised $H_2O$ and 50 ml of BuEtOH. Thus, both $HNO_3$ and $H_2O$ are mixed in an excess of a solvent before they are added to the PZT solution, resulting in a homogeneous distribution of hydroxyl groups among the dissolved metal atoms, thereby assuring molecular homogeneity throughout the entire film formation process.

BRIEF DESCRIPTION OF THE DRAWINGS

FIG. 1 represents a process flow diagram, according to an embodiment of the

DETAILED DESCRIPTION OF THE INVENTION

A fundamental and straightforward prerequisite for the production of thin high quality ferro-electric films using a sol-gel technique is a high quality precursor solution, whose characteristics are adapted to the needs of thin film fabrication. The extend of polymer branching or aggregation and the condensation rate are believed to determine the packing efficiency and thus the quality of a thin ferro-electric film. Polymeric species are structurally characterized by the mass fractal dimension, which is in fact a measure for the extend of polymer branching. The mass fractal dimension influences the steric constraints between separate polymeric structures. When the mass fractal dimension has a high value, the polymers have elaborated branch structures, which enhance cross-linking and therefore hamper the interpenetration of said polymers. Consequently a low packing efficiency is obtained leading to a high defect density of the resulting film. On the other hand, a low value for the mass fractal dimension, leads to weakly branched extended polymers, thereby reducing the possibility for cross-linking and thus enhancing interpenetration of said polymers, and results in a high packing efficiency and high quality films. Consequently, in realistic systems, polymeric structures which are forced into close proximity of each other, e.g. by increasing the concentration, can freely interpenetrate one another if the mass fractal dimension is sufficiently low, i.e. typically smaller then about 2.

In general, hydrolysis, when not properly controlled, is believed to result in an increase of the mass fractal dimension of the polymeric structures involved. Contrary, acid-catalyzed hydrolysis conditions, especially with a low $H_2O$/metal ratio and a precise homogeneity control, are believed to result in weakly branched, extended polymers. These polymers can interpenetrate during film formation, when the concentration is increased by evaporation of the precursor solution, as long as condensation does not inhibit the flow of said polymers. Consequently, very dense high quality films are formed.

Figure 1:
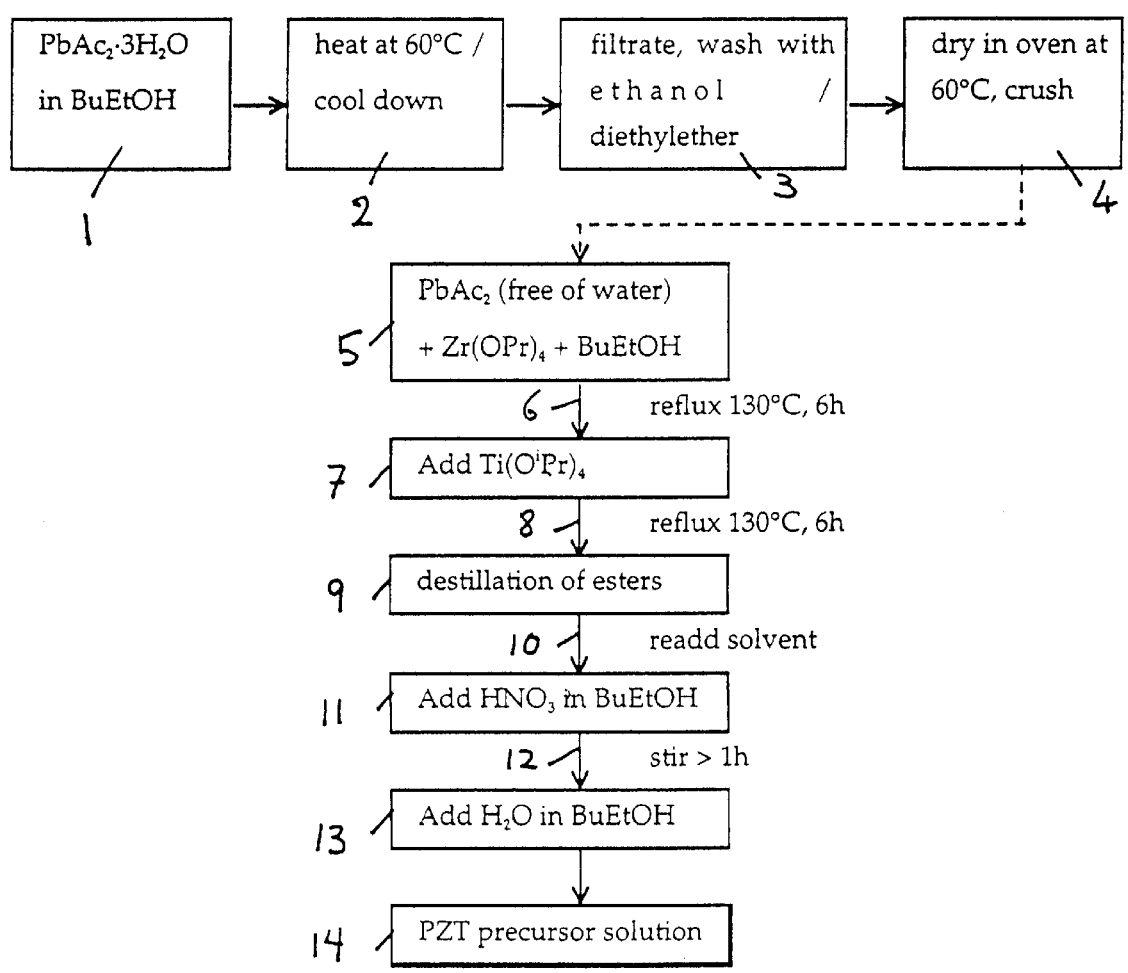

In an embodiment of the invention a PZT precursor solution for ferro-electric thin film fabrication is disclosed comprising lead, titanium and zirconium. Particularly a 1.12 molar $Pb(Zr_xTi_{1-x})O_3$ precursor solution (14) is prepared by means of an organic sol-gel route (FIG. 1). Preferably x is in the range from 0.1 to 0.4. Starting products are hydrate lead acetate with chemical formula $PbAc_2.3H_2O$ (commercially available from Merck), $Zr(OPr)_4$ (70% in propanol, commercially available from Fluka), $Ti(O^iPr)_4$ and 2-butoxyethanol (both commercially available from Acros).

According to the present invention, before introduction in the PZT solution, the hydrate lead acetate is dehydrated by means of recrystallization. This dehydration is performed to prevent spontaneous uncontrolled hydrolysis. As mentioned before, hydrolysis can lead to an increase of the polymeric mass fractal dimension. A preferred way of performing said dehydration is described in the sequel.

The hydrate lead acetate is dissolved in butoxyethanol (BuEtOH) (1) at 60° C. The resulting solution is kept at this temperature for two hours, and is cooled down slowly (2) to thereby form a precipitate of dehydrated lead acetate. The precipitation yield can be promoted by further cooling down the vessel containing said solution in an ice bath.

Said dehydrated lead acetate is then vacuum filtrated, twice washed with ethanol (3) (commercially available from U.C.B.) and once with diethylether (U.C.B.).

Said dehydrated lead acetate is dried in a conventional furnace at 60° C. (4) to remove solvent remnants. After crushing the dehydrated lead acetate, it can be stored for several months in a desiccator without any take-up of water. Unlike the hydrated lead acetate, said dehydrated lead acetate is not soluble in butoxyethanol. However, in the presence of at least one alkoxide it dissolves completely.

To prepare the PZT solution, said dehydrated lead acetate is mixed in a flask together with a solvent (2-butoxyethanol) and $Zr(OPr)_4$ (5) The flask is connected to a condenser with a nitrogen filled balloon on top. The mixture, containing a 16% (atomic) excess of said dehydrated lead acetate, is flushed with the nitrogen and then heated in an oil bath up to 130° C. for six hours (5) while agitating said mixture by means of magnetic stirring.

Further, the solution is cooled down and $Ti(O^iPr)_4$ is added (6). The system is again flushed and refluxed for six hours at 130° C. (8). After cooling down and weighing the filled flask, the resulting clear solution, said clarity being a good indicator for the homogeneity of the solution, is distilled under vacuum to remove the esters that are formed during reaction of the acetate with the alkoxides. Distilling said esters (9) leads to a controllable hydrolysis.

A solvent, preferably BuEtOH, is then re-added (10) until the initial weight is reached, and the solution is agitated long enough to be sure that the solvent is homogeneously mixed with the solution. By using a mixture (11) of 2 ml $HNO_3$ (70%, Baker) and 50 ml of BuEtOH, 0.0562 mole $HNO_3$ per mole of PZT is added to the solution while vigorously agitating (12).

After at least one hour 0.14 mole $H_2O$ per mole of PZT is added (13) by using a mixture of 1.02 ml deionised $H_2O$ and 50 ml of BuEtOH. Remark that this hydrolysis is acid catalysed, which limits the condensation rate, and consequently has a positive influence on the packing efficiency. Further remark that the hydrolysis ratio (mole $H_2O$/mole PZT) is 0.14, which is very low and thus also leads to an increased packing efficiency.

Besides the ones already mentioned, there are two further crucial steps during the above described PZT solution formation process having a major impact on the properties of the ferro-electric thin films formed by means of a sol-gel technique using said PZT solution. Both $HNO_3$ and $H_2O$ are mixed in an excess of a solvent before they are added to the PZT solution. When adding directly, part of the alkoxides can fully be hydrolysed locally, thereby preventing a homogeneous distribution of hydroxyl groups among the metal molecules. Furthermore, unlike most publications, like e.g. the European patent EP 0674019 A1, butoxyethanol is used as a solvent in stead of methoxyethanol. Besides the less toxic properties, it offers advantages towards film density and concentration: As clearly seen in TG-FTIR measurements, condensation proceeds at much higher temperatures in comparison to methoxyethanol based solutions. This means that the interpenetration time is longer, resulting in a more perfect film microstructure.

In an aspect of the invention a method for the formation of ferro-electric films by means of a sol-gel technique is disclosed. The simplest way to form a ferro-electric film is by using a so-called single coating process. As a result a ferro-electric film, composed of a single layer, is formed on a substrate. Such a single coating process can comprise the steps of:

depositing a ferro-electric layer on said substrate by means of a sol-gel technique, i.e. the spin coating of a chemical precursor solution on a substrate;

evaporating at least the majority of the solvents by means of at least one thermal treatment;

pyrolysis, i.e. burning off of at least the majority of the organic compounds; and crystallization. However, particularly for the purpose of forming ferro-electric thick films with good electrical characteristics, i.e. films having a thickness above about 100 nm, a so-called multi coating process is used. Such a method is in fact a sequence of single coating processes wherein the intermediate crystallization steps can be omitted. A reason therefore is that after a ferro-electric layer is spin coated on a substrate, different thermal treatments are applied. During the thermal treatment of the coated layer, shrinkage occurs, e.g. due to the removal of solvent in the evaporation step and/or the removal of organic material during the pyrolysis, resulting in tensile stress build-up. This limits the maximum thickness of a ferro-electric layer formed by a single coating process because cracking will occur if the layer is too thick. In general, attempts to fabricate ferro-electric capacitors with good electrical characteristics using a single coating process, even below the maximum thickness obtainable, were not successful due to excessive leakage or shorting problems. This can be attributed to surface asperities of the underlying bottom electrodes of said capacitors, which were either not completely covered or not uniformly covered by the coated layer, and/or to particles incorporated in the coated layer. Consequently, a single coating process is not suited for forming high quality ferro-electric films.

According to the present invention a method is disclosed for the formation of a ferro-electric film on a substrate using a multi coating process based on a sol-gel technique. Said substrate can be a GaAs or a Si wafer with thereon an electrode of a conductive metal oxide, e.g. $PtO_2$, $RuO_2$ or $IrO_2$. In particular PZT films are formed using a sol-gel technique of an alkoxide-type liquid chemical PZT precursor. The extend of polymer branching and the condensation rate are believed to determine the packing efficiency and thus the quality of a ferro-electric thin film. Therefore the mass fractal dimension of the polymeric structures, where said solution is composed of, has to be sufficiently low, i.e. typically smaller then about 2. Furthermore, hydrolysis steps, used during the preparation of said precursor solution, has to be properly controlled to thereby avoid an increase of the mass fractal dimension of the polymeric structures involved. Preferably said precursor solution is a $Pb(Zr_xTi_{1-x})O_3$ precursor solution which is prepared, according to an embodiment of the invention, by means of an organic sol-gel technique. Preferably x is in the range from 0.1 to 0.4. Preferably said precursor is diluted in BuEtOH (2-butoxyethanol, which is commercially available from Acros). Using a more diluted precursor results in thinner coated layers, so in fact the thickness is dependent upon the dilution. According to the present invention, a method for the formation of a ferro-electric film, with a thickness in the range from 50 nm to 350 nm, on a substrate is disclosed, comprising the steps of:

a) depositing a ferro-electric layer of a diluted chemical PZT precursor solution on said substrate, by means of a sol-gel technique;

b) evaporating at least the majority of the solvents in said layer by means of a thermal treatment;

c) pyrolysis; and wherein the sequence of steps a), b) and c) is performed at least twice and thereafter a crystallization step is performed resulting in a film having a remnant polarisation varying less than 30% in said thickness range.

Figure 2:
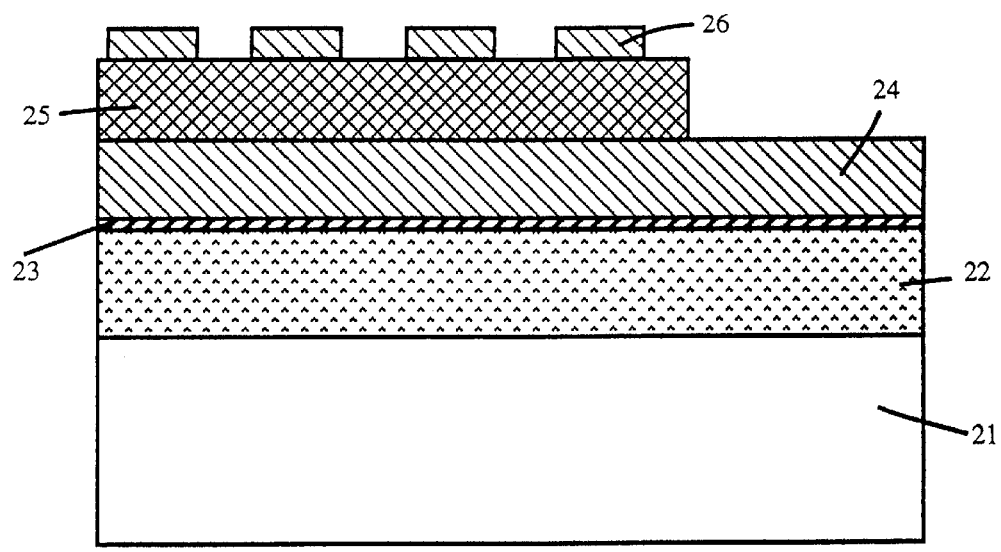
FIG. 2 represents a schematic cross-section of an exemplary capacitor comprising a dielectric layer, said dielectric layer being a ferro-electric film formed according to an embodiment of the invention.
Figure 3:
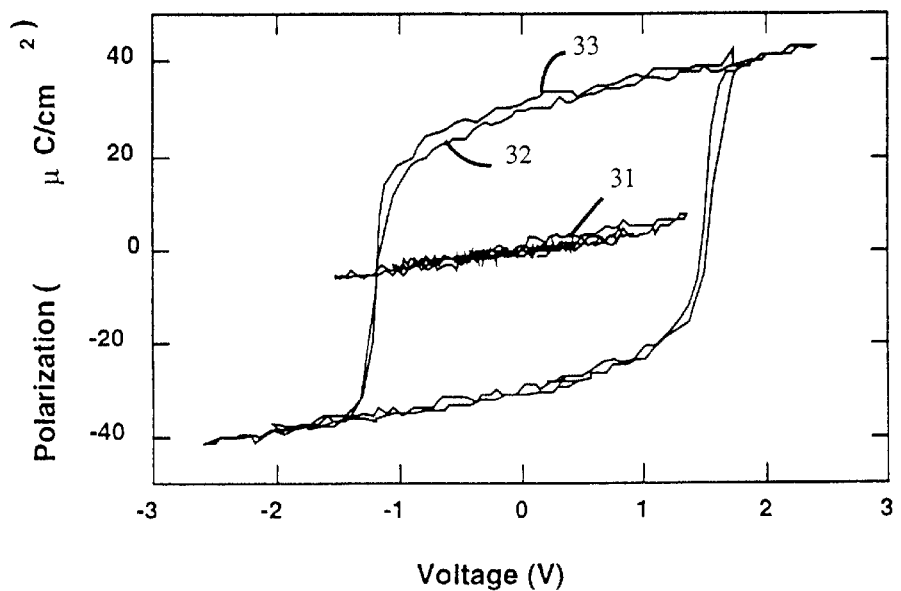
FIG. 3 represents a graph of the remnant polarisation of a film versus the voltage applied on said film for different values of the switching voltage. Said film is a three-layer ferro-electric film formed, according to an embodiment of the invention, without any intermediate crystallization steps using a sol-gel technique of a $Pb(Zr_xTi_{1-x})O_3$ precursor solution where x=0.3. Said film has a thickness of about 180 nm.

Particularly, this method is a multi-coating process where different coated layers are stacked and where heat treatments, being a sequence of evaporation steps and pyrolysis steps, are applied after each coating step. By doing so, a too large material shrinkage and tensile stress build-up during the final crystallization step, i.e. after the last coated layer, is prevented. The number of coated layers depends on the desired thickness of the ferro-electric film. Steps a), b) and c) can be performed repeatedly until at least 2 layers and maximum 6 layers are deposited. Preferably, especially if the desired film thickness is 100 nm or below 100 nm, the maximum thickness of each layer is 50 nm or smaller than 50 nm. Finally a crystallization step is performed at temperatures typically at 700° C. or below. Particularly said crystallisation step can be a heating step on a hot plate, e.g. at 600° C. during 30 minutes in an air ambient. Alternatively said crystallisation step can be a rapid thermal processing step in a furnace, e.g. at 700° C. during 5 seconds in an oxygen ambient. In a preferred embodiment of this aspect, no intermediate crystallization steps are performed. A ferro-electric film, formed without intermediate crystallization steps can comprise typically up to 6 layers. In the latter case, only one final crystallization step has to be performed. The resulting film has a very smooth, nearly indiscernible boundary structure between the different coated layers. If a larger number of layers is required, intermediate crystallization steps, e.g. every 3–5$^{th}$ layer, are required. The electrical characteristics of the films, formed according to the aforementioned multi coating process, are not dependent on the number of coated layers. A slight improvement of the electrical properties, i.e. $P_r$ value increases, with increasing film thickness is observed. This improvement is only clearly observable for films with a thickness above 200 nm. The films having a thickness from about 50 nm to 100 nm can easily withstand 10V amplitude (1kHz sine or triangular signals), i.e. corresponding with electrical fields of 2MV/cm, which is better than thicker films, e.g. 170 nm films can only withstand 14V amplitude corresponding with an electrical field of 800kV/cm In an embodiment of the invention, as an example, a method is disclosed to fabricate high-quality thickness scaled PZT films using a sol-gel technique of a $Pb(Zr1_xTi_{1-x})O_3$ precursor solution, particularly a 1.12 molar $Pb(Zr_xTi_{1-x})O_3$ precursor solution which is prepared, according to an embodiment of the invention, by means of an organic sol-gel technique (FIG. 1) is used. In fact x equals 0.3 in this example. The precursor solution is diluted according to a 1/2 ratio in BuEtOH. The aim of the experiment (see also FIG. 2) was to form a ferro-electric film (25) on a Pt electrode (24), said electrode being formed on a substrate, i.e. a silicon wafer (21) with a stack of a silicon oxide layer (22) and a Ti layer (23) thereon. In fact this electrode can form the bottom electrode, while the ferro-electric film can form the dielectric of a ferro-electric capacitor, said capacitor further comprising a Pt top electrode (26). Furthermore the final film thickness should be in the range from 170 nm to 200 nm and should have a quality allowing the use of switching voltages in the range from 2.5 to 3V. For the formation of the ferro-electric thin film, a multi coating process is used, comprising the steps of:

a) depositing a ferro-electric layer on a Pt electrode, formed on a substrate, by means of a sol-gel technique, i.e. the spin coating of a chemical precursor solution, particularly a spin rate of 3000 rpm during 30 seconds is used;

b) evaporating at least the majority of the solvents in said layer by means of a thermal treatment at 200° C. during 2 minutes on a hot plate in an air ambient;

c) pyrolysis, i.e. burning off of at least the majority of the organic compounds, at 400° C. during 2 minutes on a hot plate in an air ambient; The sequence of steps a), b) and c) is performed three times until three layers are deposited. Finally a crystallization step is performed by means of a heating step on a hot plate at 600° C. during 30 minutes in an air ambient. The resulting film has excellent electrical characteristics, i.e. high rectangularity loops and a high remnant polarisation dependent of the switching voltage. In FIG. 3 the results for switching voltages of 1.5V (31), 2V (32) and 2.5V (33) are presented yielding excellent characteristics for switching voltages down to 2V. Remark that no intermediate crystallization steps are performed. These intermediate crystallization steps are omitted because such a step results in a clearly observable boundary layer at the interface between two subsequent layers in the film. These boundary layers are believed to negatively influence the electrical characteristics of the ferro-electric film. These intermediate crystallization steps can be omitted if the total number of layers is not too large, because the largest amount of material loss and consequently of the shrinkage occurs during the evaporation and pyrolysis step.

In a best mode embodiment of the invention, as an example, a method is disclosed to fabricate high-quality thickness scaled PZT films using a sol-gel technique of a $Pb(Zr_xTi_{1-x})O_3$ precursor solution, particularly a 1.12 molar $Pb(Zr_xTi_{1-x})O_3$ precursor solution which is prepared, according to an embodiment of the invention, by means of an organic sol-gel technique (FIG. 1) is used. In fact x equals 0.3 in this example. The precursor solution is diluted according to a 1/3 ratio in BuEtOH in order to form a ferro-electric film with a thickness of 75 nm. For the formation of the ferro-electric thin film a multi coating process is used, comprising the steps of:

a) depositing a ferro-electric layer on an electrode, formed on a substrate, by means of a sol-gel technique, i.e. the spin coating of a chemical precursor solution, particularly a spin rate of 3000 rpm during 30 seconds is used;

b) evaporating at least the majority of the solvents in said layer by means of a thermal treatment at 200° C. during 2 minutes on a hot plate in an air ambient;

c) pyrolysis, i.e. burning off of at least the majority of the organic compounds, at 400° C. during 2 minutes on a hot plate in an air ambient;

Step a), b) and c) are repeated until 3 layers are deposited.

Figure 4:
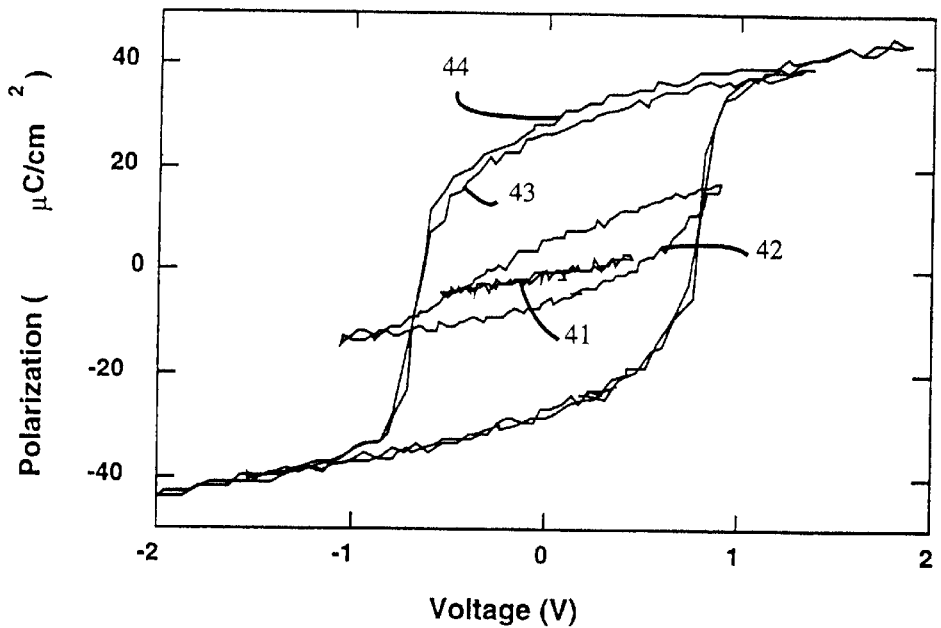
FIG. 4 represents a graph of the remnant polarisation of a film versus the voltage applied on said film for different values of the switching voltage. Said film is a three-layer ferro-electric film formed, according to an embodiment of the invention, without any intermediate crystallization steps, using a sol-gel technique of a diluted $Pb(Zr_xTi_{1-x})O_3$ precursor solution where x=0.3. Said film has a thickness of about 75 nm.
Figure 5:
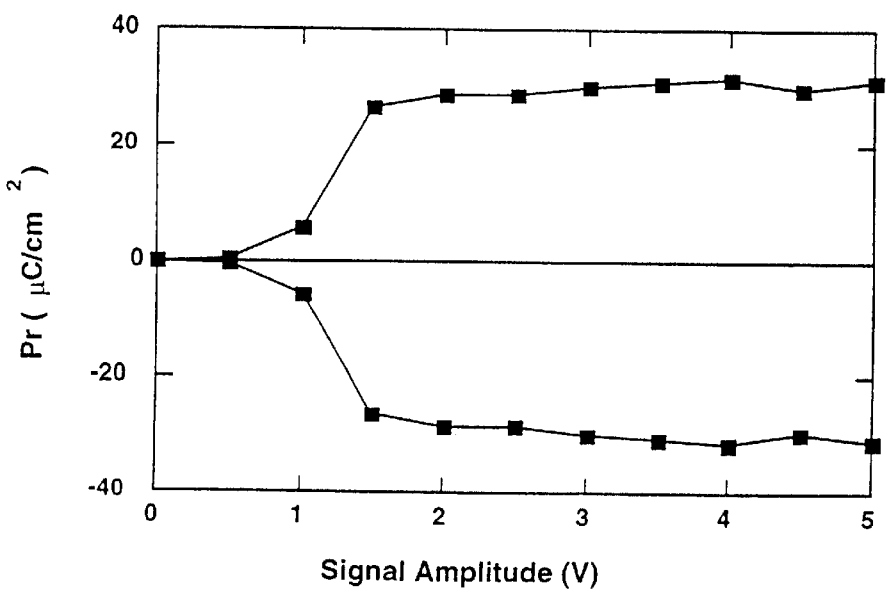
FIG. 5 represents a graph of the remnant polarisation of a film versus the signal amplitude. Said film is a three-layer ferro-electric film formed, according to an embodiment of the invention, without any intermediate crystallization steps, using a sol-gel technique of a diluted $Pb(Zr_xTi_{1-x})O_3$ precursor solution where x=0.3. Said film has a thickness of about 75 nm.

Finally a crystallization step is performed at 600° C. during 30 minutes on a hot plate in an air ambient. Remark that no intermediate crystallization steps are performed. The ferro-electric film according to this example has excellent electric characteristics a high remnant polarization, $P_r$, typically about 30 $\mu C/cm^2$ for a film thickness of 75 nm but also for films having a thickness in the range from 50 nm to 350 nm and for switching voltages down to 1.5V (43) (see FIGS. 4 and 5 FIG. 4 further presents the results for switching voltages of 0.5V (41), 1.0V (42) and 2V (44));

a coercive field, $E_c$, typically about 100kV/cm for 75 nm films and about 80kV/cm for films with a thickness of 150 nm or above;

the hysteresis loop has excellent rectangularity, and the saturation voltage is 1.5V (see also FIG. 4 and 5);

the film having a thickness from about 75 nm can easily withstand 10V amplitude (1kHz sine or triangular signals), i.e. electrical fields of about 1.3 MV/cm;

furthermore, no leakage is apparent form the hysteresis loops. There are a number of properties, characteristic for the method of the present invention, which result in said excellent electrical characteristics. At first, by using a multi coating process, particle incorporation during a layer deposition will not lead to an uncomplete coverage of the electrode. Further, if the surface of the electrode has a high degree of roughness, again said multi coating process will lead to a better coverage compared with a single coat process. Further, the precursor has been strongly diluted, resulting in thinner coated layers. Thinner coated layers, having a thickness smaller than about 40 nm to 50 nm, have a higher material removal yield during the evaporation and pyrolysis step. Consequently, films are obtained which have a denser structure and have a better intrinsic quality resulting in a high value for the electrical breakdown field. At last, because said multi coating process does not comprise intermediate crystallization steps, there is no interlayer interface, which can degrade or limit the quality of the film.

In an aspect of the invention a method is disclosed for the formation of a ferro-electric film on a substrate using a multi coating process based on a sol-gel technique. Said substrate can be a GaAs or a Si wafer with thereon an electrode of a conductive metal oxide, e.g. $PtO_2$, $RuO_2$ or $IrO_2$. In particular PZT films are formed on a substrate using a sol-gel technique of an alkoxide-type liquid chemical PZT precursor. Said precursor solution should have characteristics, which are adapted to the needs of thin film fabrication. The extent of polymer branching and the condensation rate are believed to determine the packing efficiency and thus the quality of a ferro-electric thin film. Therefore the mass fractal dimension of the polymeric structures, where said solution is composed of, has to be sufficiently low, i.e. typically smaller then about 2. Furthermore, hydrolysis steps, used during the preparation of said precursor solution, has to be properly controlled to thereby avoid an increase of the mass fractal dimension of the polymeric structures involved. Preferably said precursor solution is a $Pb(Zr_xTi_{1-x})O_3$ precursor solution which is prepared, according to an embodiment of the invention, by means of an organic sol-gel technique. Preferably x is in the range from 0.1 to 0.4. Said precursor can be diluted in BuEtOH. According to the present invention a method for the formation of a ferro-electric film, with a thickness in the range from 70 nm to 450 nm, on a substrate is disclosed, comprising the steps of:

a) depositing a ferro-electric layer of a chemical PZT precursor solution on said substrate, by means of a sol-gel technique;

b) evaporating at least the majority of the solvents in said layer by means of a thermal treatment;

c) pyrolysis;

d) crystallizing said layer at a temperature in the range of 700° C. or below 700° C. and wherein steps a), b), c) and d) are performed at least twice thereby assuring that the last step is a crystallization step and resulting in a film having a remnant polarisation varying less then 30% in said thickness range. Particularly said crystallisation step can be a heating step on a hot plate. Alternatively said crystallisation step can be a rapid thermal processing step in a furnace, e.g. at 700° C. during 5 seconds in an oxygen ambient.

Figure 6:
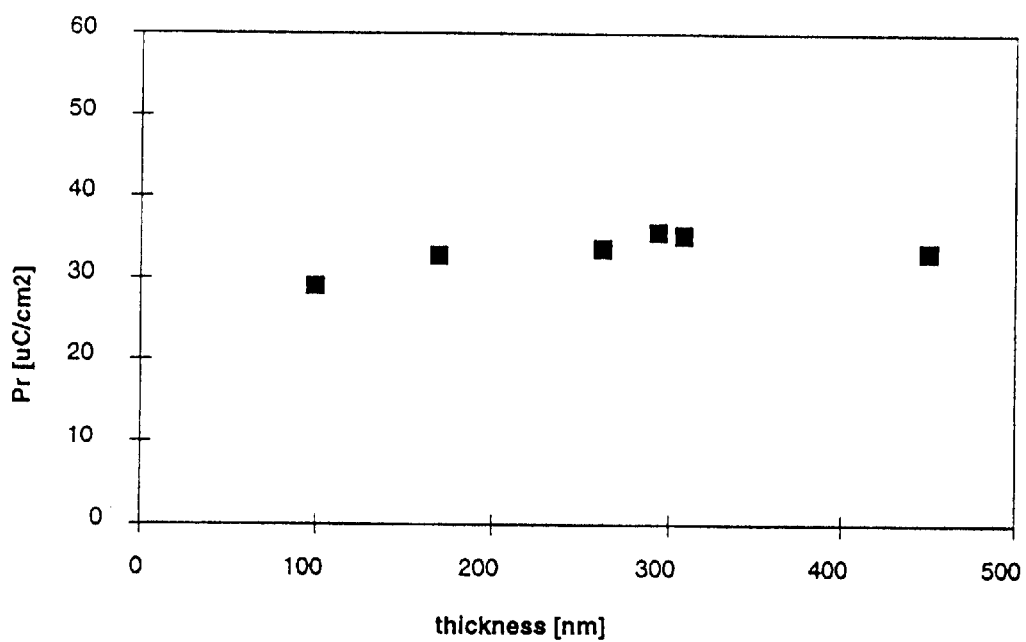
FIG. 6 represents a graph of the remnant polarisation of a ferro-electric film versus the film thickness wherein said film is formed according to an embodiment of the present invention, i.e. with intermediate crystallization steps, using a sol-gel technique of a $Pb(Zr_xTi_{1-x})O_3$ precursor solution where x=0.2.
Figure 7:
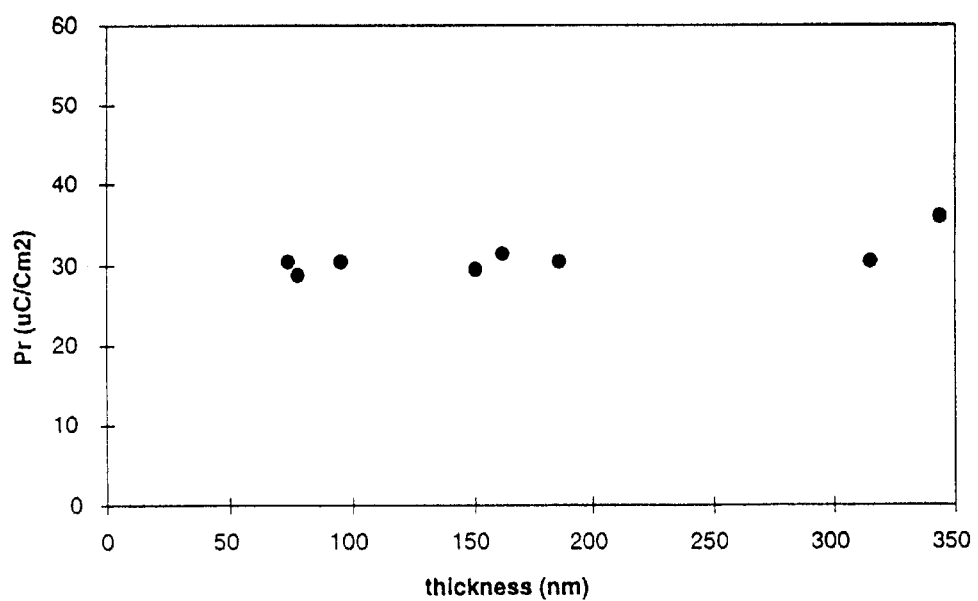
FIG. 7 represents a graph of the remnant polarisation of a ferro-electric film versus the film thickness wherein said film is formed according to an embodiment of the present invention, i.e. with intermediate crystallization steps, using a sol-gel technique of a $Pb(Zr_xTi_{1-x})O_3$ precursor solution where x=0.3.

So, according to the present invention, different coated layers are stacked and heat treatments are applied after each coating step . Except for the last coated layer, i.e. the intermediate layers, these heat treatments can be either a sequence of evaporation steps and pyrolysis steps, or a sequence of evaporation steps, pyrolysis steps and crystallization steps. Preferably these crystallization steps are only performed if the thickness of the film formed since the last crystallization step is minimum about 40 to 50 nm. Concerning the last coated layer, said heat treatments is a sequence of evaporation steps, pyrolysis steps and crystallization steps. Consequently, at least two layers are deposited thereby assuring that the last step is always a crystallization step. By doing so, a too large material shrinkage and tensile stress build-up during the final crystallization steps, i.e. after the last coated layer, is prevented. The number of coated layers depends on the desired thickness of the ferro-electric film. The electrical characteristics of the films as formed are not dependent on the number of coated layers. There are a number of properties, characteristic for the method of the present invention, and resulting in said excellent electrical characteristics. In fact said method comprises a multi coating process wherein a reduced number of coated layers is used but where intermediate crystallization steps are used. The ferro-electric films formed using this method have excellent electrical characteristics, i.e. a high remnant polarization, $P_r$, typically about 30uC/cm2 for films having a thickness in the range from 70 nm to 450 nm, e.g. as it is presented in FIG. 6 using a $Pb(Zr_xTi_{1-x})O_3$ precursor solution with x=0.2 and in FIG. 7 using a $Pb(Zr_xTi_{1-x})O_3$ precursor solution with x=0.3.

A reason why such excellent electrical properties are obtained despite the intermediate crystallization is that this crystallization is performed at a moderate temperature of 700° C. or below. At this temperature, the crystallization is incomplete resulting in a non-perovskite top-surface layer. This is caused by the loss of Pb (to the atmosphere) and preferential Pb and Ti depletion in the uncrystallized part of the layer, as e.g. in S. Wahl et al, Proceedings of Electroceramics V, Sep. 2–4, 1996, book I pp. 347–350. Pb is known to be increasingly mobile with increasing temperature. Furthermore, the crystallization rate of the ferroelectric, i.e. PZT, coated layer is enhanced when the Pb and Ti content is increased but segregation of Pb and Ti takes place at the crystallization interface. If however the Pb and Ti content becomes too low, complete crystallization, i.e. perovskite phase conversion, stops. The minimum Pb and Ti content required for complete crystallization is temperature dependent. If a subsequent coated layer is applied on top of this layer, in the initial stage of a subsequent heat treatment, e.g. an evaporation step, the lead and titanium content of the bottom layer is again enriched from said subsequent layer. Afterwards, during the next crystallization step, the crystallization of said subsequent coated layer can proceed without a strongly-deteriorated barrier.

Figure 8:
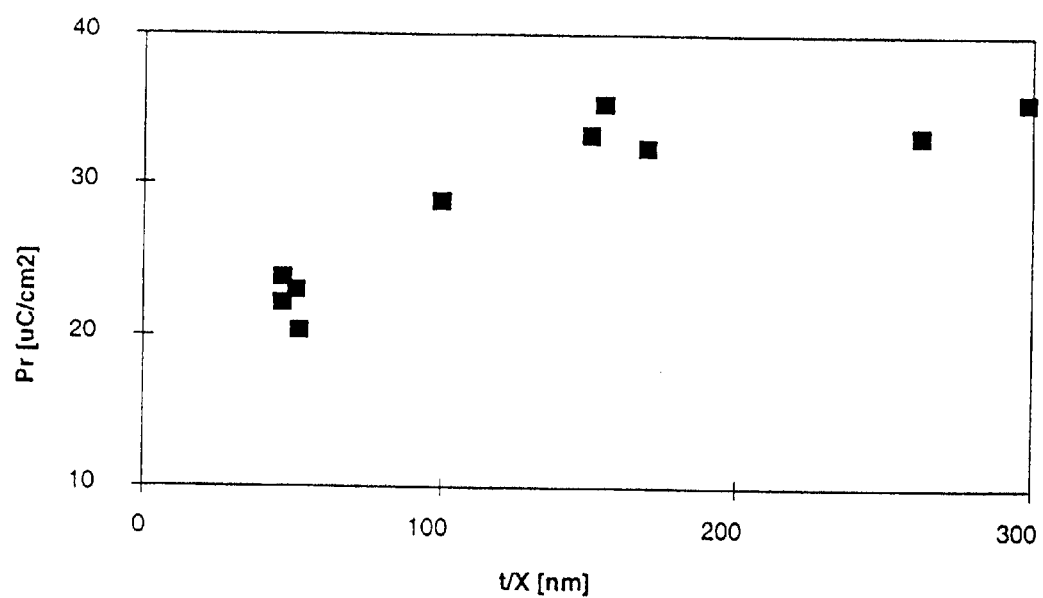
FIG. 8 represents a graph of the remnant polarisation of a ferro-electric film versus the thickness per crystallization, i.e. the thickness of a part of the film formed since the previous (intermediate) crystallization step until the next (intermediate) crystallization step is performed, wherein said film is formed according to an embodiment of the present invention using a sol-gel technique of a $Pb(Zr_xTi_{1-x})O_3$ precursor solution where x=0.2.
Figure 9:
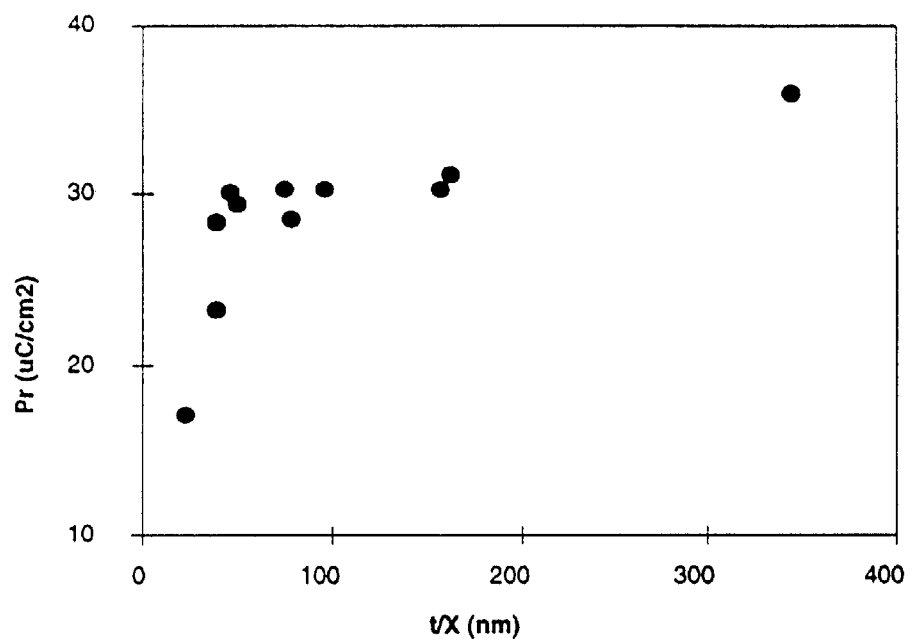
FIG. 9 represents a graph of the remnant polarisation of a ferro-electric film versus the thickness per crystallization, i.e. the thickness of a part of the film formed since the previous (intermediate) crystallization step until the next (intermediate) crystallization step is performed, wherein said film is formed according to an embodiment of the present invention using a sol-gel technique of a $Pb(Zr_xTi_{1-x})O_3$ precursor solution where x=0.3.
Figure 10:
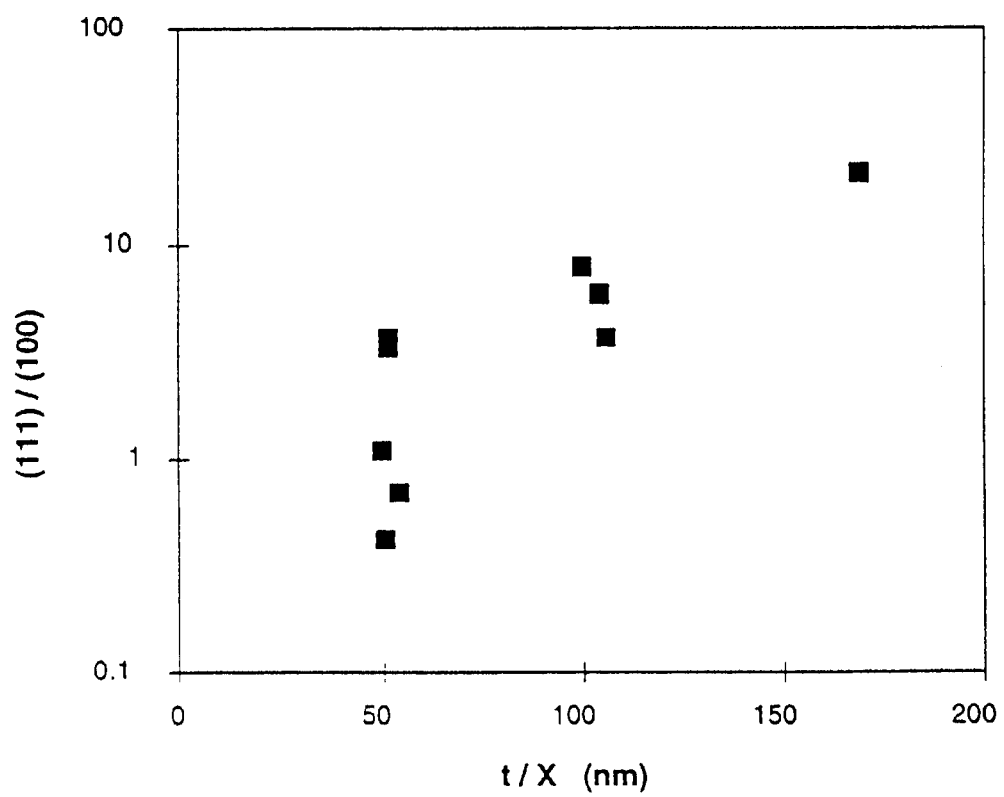
FIG. 10 represents a graph of the orientation (111)/(100) peak intensity ratio of a ferro-electric film versus the thickness per crystallization, i.e. the thickness of a part of the film formed since the previous (intermediate) crystallization step until the next (intermediate) crystallization step is performed, wherein said film is formed according to an embodiment of the present invention using a sol-gel technique of a $Pb(Zr_xTi_{1-x})O_3$ precursor solution where x=0.2.
Figure 11:
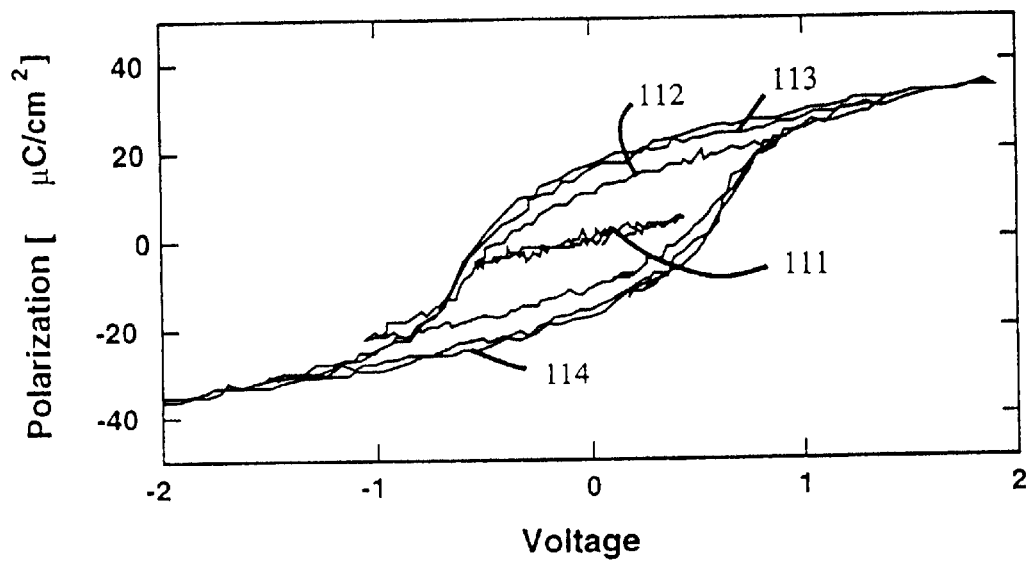
FIG. 11 represents a graph of the remnant polarisation of a film versus the voltage applied on said film for different values of the switching voltage. Said film is formed with a thickness per crystallization, i.e. the thickness of a part of the film formed since the previous (intermediate) crystallization step until the next (intermediate) crystallization step is performed, below 40 nm.

Another reason why such excellent electrical properties can be obtained despite the intermediate crystallization steps is due to the fact that this intermediate crystallization step is not performed until the thickness of a part of the film formed since the previous crystallization step, hereafter referred to as the thickness per crystallization, has a minimum value of about 40 to 50 nm, i.e. the so-called critical thickness. Preferably this intermediate crystallization step is a rapid thermal processing step in a furnace. It is observed that the remnant polarisation of the total film formed deteriorates strongly if the thickness per crystallization has a value below the critical thickness of about 40 to 50 nm, as e.g. presented in FIG. 8 where a $Pb(Zr_xTi_{1-x})O_3$ precursor solution with x=0.2 is used as well as in FIG. 9 where a $Pb(Zr_xTi_{1-x})O_3$ precursor solution with x=0.3 is used. It is also observed that the rectangularity of the hysteresis loops of the total film formed deteriorates strongly if the thickness per crystallization has a value below the critical thickness of about 40 to 50 nm, as e.g. presented in FIG. 11, where a $Pb(Zr_xTi_{1-x})O_3$ precursor solution with x=0.2 is used and where different switching voltages of 0.5V (111), 1V (112), 1.5V (113) and 2V (114) are applied. X-ray diffraction measurements on PZT films with a thickness per crystallization below the critical thickness reveal a loss of preferential (111) orientation and an increase of the undesirable (100) orientation leading to the aforementioned deterioration, as e.g. is presented in FIG. 10 where a $Pb(Zr_xTi_{1-x})O_3$ precursor solution with x=0.2 is used for the film formation.

Figure 12:
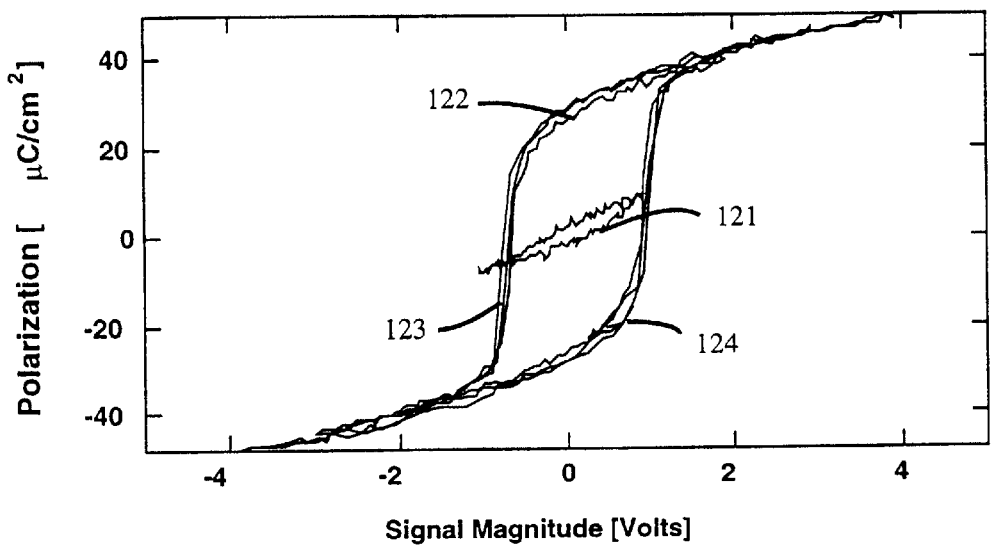
FIG. 12 represents a graph of the remnant polarisation of a ferro-electric film versus the voltage applied on said film for different values of the switching voltage. Said film is a two-layer ferro-electric film formed, according to an embodiment of the invention, with one intermediate crystallization step, using a sol-gel technique of a $Pb(Zr_xTi_{1-x})O_3$ precursor solution where x=0.3. Said film has a thickness of about 80 nm.

In a best mode embodiment of the invention, as an example, a method is disclosed to fabricate high-quality thickness scaled PZT films using a sol-gel technique of a $Pb(Zr_xTi_{1-x})O_3$ precursor solution, particularly a 1.12 molar $Pb(Zr_xTi_{1-x})O_3$ precursor solution which is prepared, according to an embodiment of the invention, by means of an organic sol-gel technique (FIG. 1) is used. In fact x equals 0.3 in this example. The precursor solution is diluted according to a 1/2 ratio in BuEtOH in order to form a ferro-electric film with a thickness of 80 nm to 100 nm. For the formation of the ferro-electric thin film a multi coating process is used, comprising the steps of:

a) depositing a ferro-electric layer on an electrode, formed on a substrate, by means of a sol-gel technique, i.e. the spin coating of a chemical precursor solution, particularly a spin rate of 3000 rpm during 30 seconds is used;

b) evaporating at least the majority of the solvents in said layer by means of a thermal treatment at 200° C. during 2 minutes on a hot plate in an air ambient;

c) pyrolysis, i.e. burning off of at least the majority of the organic compounds, at 400° C. during 2 minutes on a hot plate in an air ambient;

d) crystallizing said layer by means of a heating step at 600° C. during 30 minutes on a hot plate in an air ambient. The sequence of steps a), b), c) and d) is performed twice thereby forming a film comprising 2 layers. The ferro-electric film formed has a thickness of 80 nm and has excellent electrical characteristics down to a switching voltage of 2V: e.g. a high remnant polarization, $P_r$, of about 30 $\mu C/cm^2$, as presented in FIG. 12 for different switching voltages of 1V (121), 2V (122), 3V (123) and 4V (124).

What is claimed is:

1. A method for the formation of a ferro-electric film with a thickness in the range from 50 nm to 350 nm on a substrate comprising:

a) depositing a ferro-electric layer of a chemical PZT precursor solution on said substrate, by means of a sol-gel technique;

b) evaporating at least the majority of the solvents in said layer by means of a thermal treatment at a first temperature;

c) inducing pyrolysis at a second temperature higher than said first temperature; and wherein the sequence of a), b) and c) is performed at least twice to thereby form a plurality of ferro-electric layers of said ferro-electric film, each of said ferro-electric layers of said plurality having a thickness of 50 nm or smaller than 50 nm, and thereafter a crystallization is performed resulting in said ferro-electric film having a remnant polarization varying less than 30% in said thickness range.

2. A method as recited in claim 1, wherein the thickness of said ferro-electric film is 100 nm or smaller than 100 nm.

3. A method as recited in claim 1, wherein said precursor is an alkoxide-type liquid chemical PZT precursor which is diluted in butoxyethanol.

4. A method as recited in claim 1, wherein said precursor is an alkoxide-type liquid chemical PZT precursor and wherein the mass fractal dimension of the polymeric structures, where said precursor is composed of, is equal to or smaller than 2.

5. A method as recited in claim 1, wherein said crystallization is performed either on a hot plate or in a furnace using rapid thermal processing at a temperature in the range of 700° C. or below 700° C.

6. A method for the formation of a ferro-electric film with a thickness in the range from 70 nm to 450 nm on a substrate comprising:

a) depositing a ferro-electric layer on said substrate, by means of a sol-gel technique of a chemical PZT precursor solution;

b) evaporating at least the majority of the solvents in said layer by means of a thermal treatment;

c) pyrolysis; and wherein the sequence of a), b), and c) can be repeatedly performed to thereby form a plurality of ferro-electric layers of said ferro-electric film;

d) crystallizing said plurality of ferro-electric layers at a temperature of 700° C. or below 700° C. and wherein the sequence of a), b), c) and d) are performed at least twice thereby assuring that the last event is crystallization and resulting in said ferro-electric film having a remnant polarization varying less than 30% in said thickness range.

7. A method as recited in claim 6, wherein said sequence of a), b) and c) is performed until the thickness of said plurality of ferro-electric layers is at least 40 nm.

8. A method as recited in claim 6, wherein said pyrolysis is performed at a temperature in the range from 300 to 500° C. without forming perovskite crystals in said ferro-electric layer.

9. A method as recited in claim 8, wherein said thermal treatment is performed at a temperature in the range from 150 to 250° C.

10. A method as recited in claim 6 wherein said precursor is an alkoxide-type liquid chemical PZT precursor and wherein the mass fractal dimension of the polymeric structures, where said precursor is composed of, is equal to or smaller than 2.

11. A method as recited in claim 6, wherein said precursor is an alkoxide-type liquid chemical PZT precursor which is diluted in butoxyethanol.

12. A method as recited in claim 6, wherein the thickness of said ferro-electric film is 100 nm or smaller than 100 nm.

13. A method for the formation of a ferro-electric film with a thickness in the range from 50 nm to 350 nm on a substrate comprising:

a) depositing a ferro-electric layer of an alkoxide-type chemical PZT precursor which is diluted in butoxyethanol on said substrate, by means of a sol-gel technique;

b) evaporating at least the majority of the solvents in said layer by means of a thermal treatment at a first temperature;

c) inducing pyrolysis at a second temperature higher than said first temperature; and wherein the sequence of a), b) and c) is performed at least twice to thereby form a plurality of ferro-electric layers of said ferro-electric film, each of said ferro-electric layers of said plurality having a thickness of 50 nm or smaller than 50 nm, and thereafter a crystallization is performed resulting in said ferro-electric film having a remnant polarization varying less than 30% in said thickness range.

* * * * *